(12) United States Patent
Lee

(10) Patent No.: US 7,160,816 B2
(45) Date of Patent: Jan. 9, 2007

(54) METHOD FOR FABRICATING SEMICONDUCTOR DEVICE

(75) Inventor: Seong-Wook Lee, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 356 days.

(21) Appl. No.: 10/735,729

(22) Filed: Dec. 16, 2003

(65) Prior Publication Data

US 2004/0185671 A1  Sep. 23, 2004

(30) Foreign Application Priority Data

Mar. 21, 2003  (KR) ............... 10-2003-0017842

(51) Int. Cl.
  *H01L 21/302* (2006.01)
(52) U.S. Cl. ............... 438/756; 438/239; 438/694; 438/749; 438/757
(58) Field of Classification Search ............... 438/239, 438/694, 749, 756, 757

See application file for complete search history.

(56) References Cited

U.S. PATENT DOCUMENTS

| 6,380,030 | B1 | 4/2002 | Chen et al. |
| 6,448,141 | B1 | 10/2002 | Ahmad et al. |
| 6,468,855 | B1 | 10/2002 | Leung et al. |
| 6,475,847 | B1 | 11/2002 | Ngo et al. |
| 6,562,679 | B1 * | 5/2003 | Lee et al. ............ 438/253 |
| 6,893,914 | B1 * | 5/2005 | Kim et al. ............ 438/241 |

* cited by examiner

*Primary Examiner*—George A. Goudreau
(74) *Attorney, Agent, or Firm*—Mayer Brown Rowe & Maw LLP

(57) ABSTRACT

The present invention relates to a method for fabricating a semiconductor device. In more detail of the aforementioned method, a first mask layer covering a cell region is formed on an insulation layer in the cell region. Meanwhile, a second mask layer is formed in a peripheral circuit region with a predetermined distance from the first mask layer. The insulation layer is then etched with use of the first and the second mask layers as an etch mask to form a spacer at both sidewalls of each gate line pattern in the peripheral region and simultaneously form a guard beneath the second mask layer. The first and the second mask layers are removed thereafter. Next, a third mask layer opening the cell region but covering the whole regions including a guard region in the peripheral circuit region is formed. A wet etching process is performed to the insulation layer remaining in the cell region by using the third mask layer as an etch mask.

7 Claims, 5 Drawing Sheets

METHOD FOR FABRICATING SEMICONDUCTOR DEVICE

FIELD OF THE INVENTION

The present invention relates to a method for fabricating a semiconductor device; and, more particularly, to method for fabricating a semiconductor device with a spacer.

DESCRIPTION OF RELATED ARTS

Recently, an embedded dynamic random access memory (DRAM) device, wherein a cell array and a logic circuit of a DRAM device are realized into one chip, has been vigorously researched and developed. To realize the embedded DRAM device, it is necessary to form a junction region having a depth in a certain range as like the depth of a source/drain region of a peripheral circuit region. At this time, a width of a gate spacer should be wide enough as well.

Large-scale integration of a semiconductor device causes a pitch between word lines to be decreased. Thus, a region between neighbored gate spacers decreases as a width of a gate spacer increases. However, voids are generated when an inter-layer insulation layer is subsequently filled into the region between gate spacers, and a contact resistance also increases due to a decreased size of a bottom area of a self-aligned contact (SAC) during the formation of the SAC.

Figure 1A:
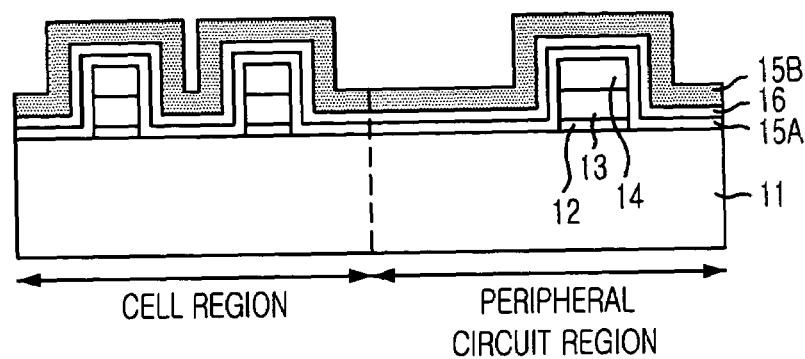
Figure 1B:
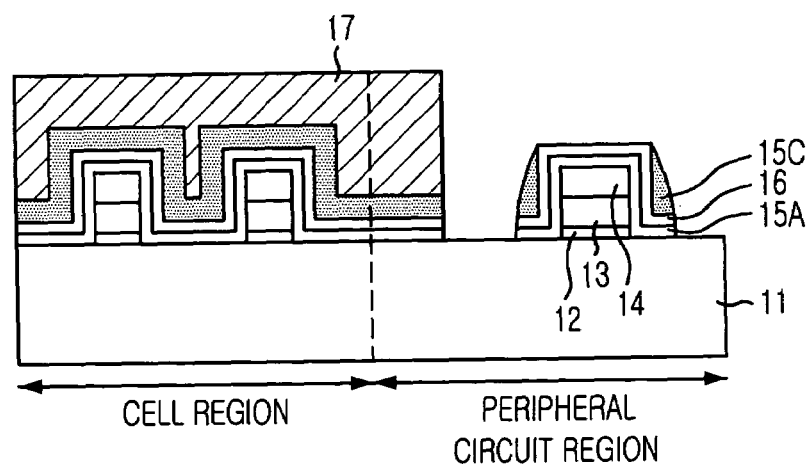
Figure 1C:
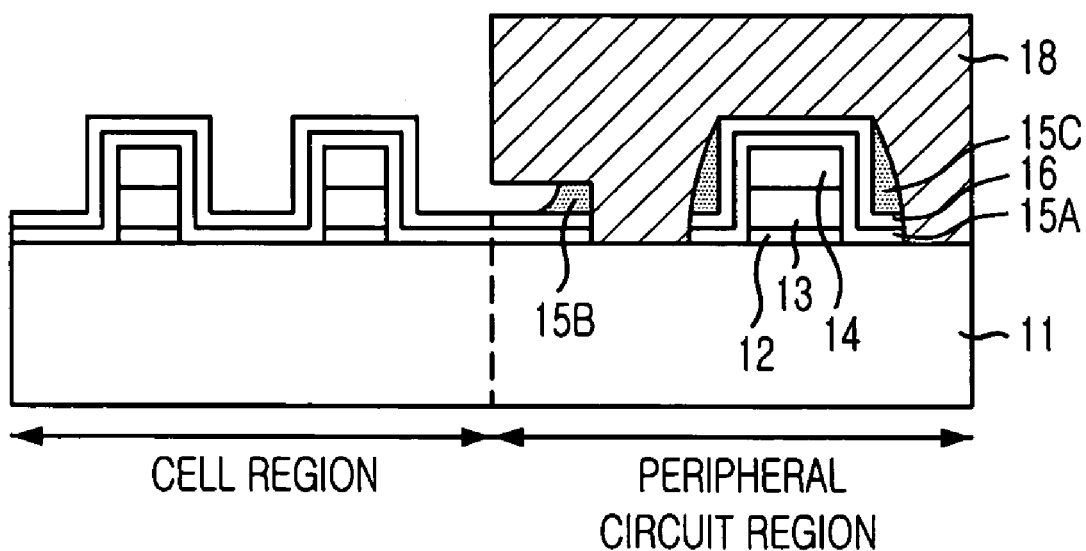

FIGS. 1A to 1C are cross-sectional views of a semiconductor device fabricated by a conventional method.

Referring to FIG. 1A, a gate oxide layer 12 is formed on a substrate 11 with a defined cell region and peripheral circuit region. A gate electrode 13 and a gate hard mask 14 are formed on the gate oxide layer 12 to form a plurality of gate line patterns through a gate patterning process. At this time, the gate line patterns are formed in each of the cell region and the peripheral circuit region. Then, a first oxide layer 15A, a nitride layer 16 and a second oxide layer 15B are sequentially deposited on the above resulting structure.

Next, as shown in FIG. 1B, a photosensitive layer is coated on the second oxide layer 15B and is patterned through a photo-exposure and developing process to form a first mask layer 17 covering an entire area of the cell region but a partial portion of the peripheral circuit region. At this time, in the peripheral circuit region, the first mask layer 17 covers the rest portion except for the portion for forming a spacer at sidewalls of the gate line. The second oxide layer 15B exposed by the first mask layer 17 is etched to form an oxide spacer 15C contacting to both sidewalls of the gate line pattern.

Referring to FIG. 1C, the first mask layer 17 is removed, and a photosensitive layer is coated again on the above constructed structure. Thereafter, the photosensitive layer is patterned through a photo-exposure and developing process to form a second mask layer 18 covering the peripheral circuit region but opening the cell region. Then, the second oxide layer 15B exposed by the second mask layer 18 in the cell region is subjected to a wet etching process. At this time, the nitride layer 16 functions as an etch barrier layer so that the first oxide layer 15A formed beneath the nitride layer 16 is not etched.

However, during the opening process for removing the second oxide layer 15B in the cell region, the second oxide layer 15B is etched more than its intended masked portions due to the prolonged wet etching process which eventually results in an attack of a wet chemical to the masked second oxide layer 15B. As a result, it is necessary to consider carefully this fact when establishing a database.

Conversely, if a period for the wet etching process is not sufficient enough, there remain scummy remnants or the second oxide layer 15B is not completely removed. Hence, it may be difficult to set a proper etch target and there might be a burden on an excessive etching.

SUMMARY OF THE INVENTION

It is, therefore, an object of the present invention to provide a method for fabricating a semiconductor device capable of solving problems of difficulties in establishing a correspondent database due to damages or loss of sidewalls of a spacer insulation layer resulted from a prolonged period of a wet etching process for etching the spacer insulation layer remaining in a cell region and in setting a proper etch target because of scummy remnants generated by a shortened wet etching period.

In accordance with an aspect of the present invention, there is provided a method for fabricating a semiconductor device, including the steps of: forming a plurality of gate line patterns on a substrate with a defined cell region and a peripheral circuit region; forming sequentially a first insulation layer and a second insulation layer; forming a first mask layer covering the cell region on the second insulation layer in the cell region and forming a second mask layer in the peripheral circuit region with a predetermined distance from the first mask layer; etching the second insulation layer with use of the first and the second mask layers as an etch mask to form a spacer at both sidewalls of each gate line pattern in the peripheral region and simultaneously form a guard beneath the second mask layer; removing the first and the second mask layers; forming a third mask layer opening the cell region but covering the whole regions including a guard region in the peripheral circuit region; and performing a wet etching process to the second insulation layer remaining in the cell region by using the third mask layer as an etch mask.

BRIEF DESCRIPTION OF THE DRAWING(S)

The above and other objects and features of the present invention will become apparent from the following description of the preferred embodiments given in conjunction with the accompanying drawings, in which:

FIGS. 1A to 1C are cross-sectional views of a conventional semiconductor device; and FIGS. 2A to 2E are cross-sectional views of a semiconductor device fabricated in accordance with a preferred embodiment of the present invention.

DETAILED DESCRIPTION OF THE INVENTION

Hereinafter, a method for fabricating a semiconductor device in accordance with the present invention will be described in more detail with reference to FIGS. 2A to 2E in the following.

Figure 2A:
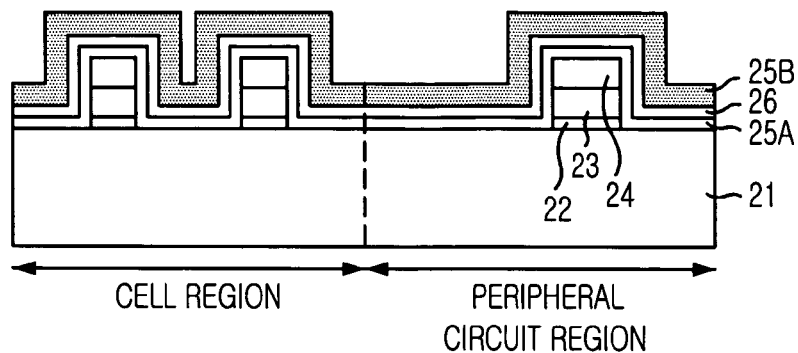

Referring to FIG. 2A, a gate oxide layer 22 is formed on a substrate 21 with a defined cell region and peripheral circuit region. A gate electrode 23 and a gate hard mask 24 are sequentially formed on the gate oxide layer 22 to form a plurality of gate line patterns through a gate patterning process. At this time, the gate line patterns are formed in each of the cell region and the peripheral circuit region. Then, a first oxide layer 25A, a nitride layer 26 and a second oxide layer 25B are sequentially deposited on the above resulting structure.

Particularly, the first oxide layer 25A is a buffer layer for releasing stress exerted to the substrate 21 when the nitride layer 26 is deposited on the substrate 21. The nitride layer 26 is a barrier layer used in case of employing a recipe for rendering high etch selectivity for attaining a self-aligned characteristic during a self-aligned contact (SAC) etching process. Also, the first oxide layer 25A, the nitride layer 26 and the second oxide layer 25B have a thickness of about 100 Å, about 100 Å and about 300 Å, respectively.

Figure 2B:
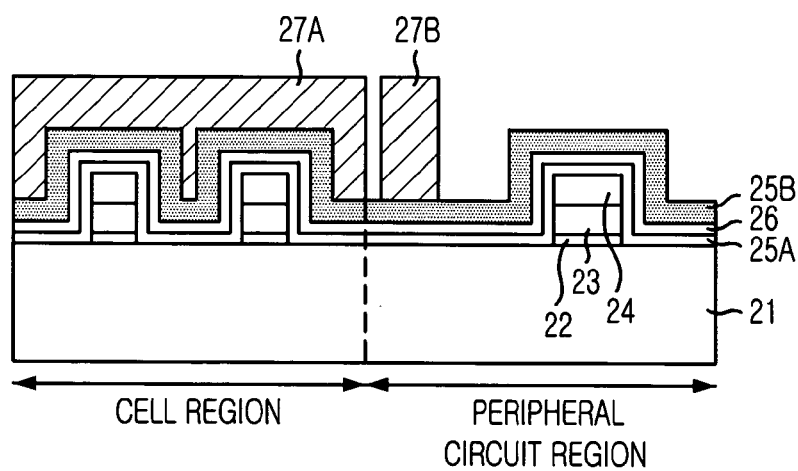

Referring to FIG. 2B, a photosensitive layer is coated on the second oxide layer 25B and is patterned through a photo-exposure and developing process to form a peripheral circuit region opening mask layer 27A and a wall mask layer 27B. Particularly, the peripheral circuit region opening mask layer 27A covers the whole region of the cell region while opening the peripheral circuit region. Meanwhile, the wall mask layer 27B covers a partial portion of the peripheral circuit region. At this time, the wall mask layer 27B covers the partial portion of the peripheral circuit region with a predetermined distance from the peripheral circuit region opening mask layer 27A. These peripheral circuit region opening mask layer 27A and the wall mask layer 27B are mask layers for forming a spacer at sidewalls of each gate line pattern in the peripheral circuit region.

Figure 2C:
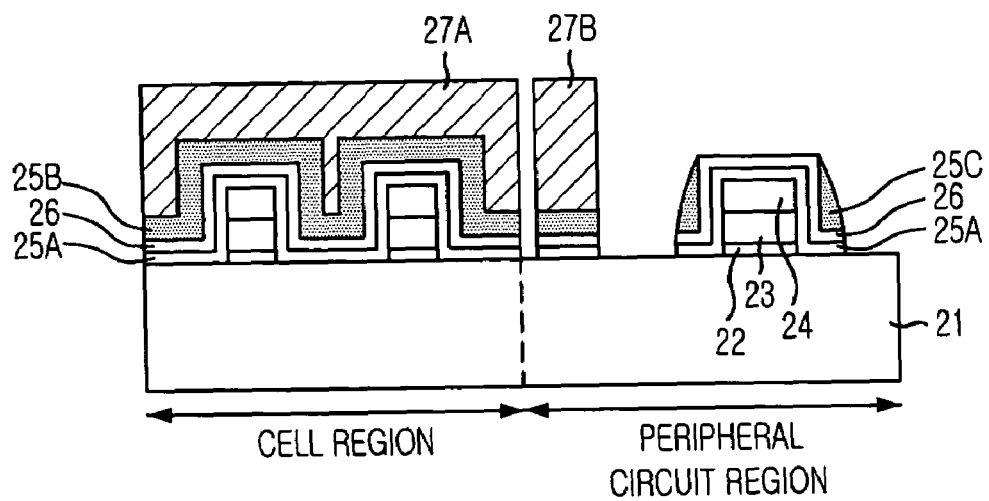

Referring to FIG. 2C, an etch-back process is performed to the second oxide layer 25B by using the peripheral circuit region opening mask layer 27A and the wall mask layer 27B as an etch mask. After the etch-back process, a spacer 25C made of the second oxide layer 25B is formed at both sidewalls of the gate line pattern in the peripheral circuit region. At this time, the nitride layer 26 and the first oxide layer 25A in the peripheral circuit region are concurrently etched away by the above etch-back process so as to form a triple spacer constituted with a dome-type spacer and an L-type spacer including the first oxide layer 25A and the nitride layer 26.

The first oxide layer 25A, the nitride layer 26 and the second oxide layer 25B formed beneath the wall mask layer 27B are not affected by the above etch-back process and remain as a guard. However, at a separated space between the peripheral circuit opening mask layer 27A and the wall mask layer 27B, the first oxide layer 25A, the nitride layer 26 and the second oxide layer 25B are etched away by the etch-back process so that a surface of the substrate 21 disposed in a boundary region between the cell region and the peripheral circuit region is exposed.

In the peripheral circuit region, the guard is formed in a manner that it covers regions except for an ion-implantation region. That is, after the formation of the spacer 25C, a source/drain of a transistor is formed by performing an n-type or p-type ion-implantation through the use of an ion-implantation mask and an etching.

As described above, the guard constituted with the first oxide layer 25A, the nitride layer 26 and the second oxide layer 25B covers the rest regions except for the spacer region and the ion-implantation region.

Figure 2D:
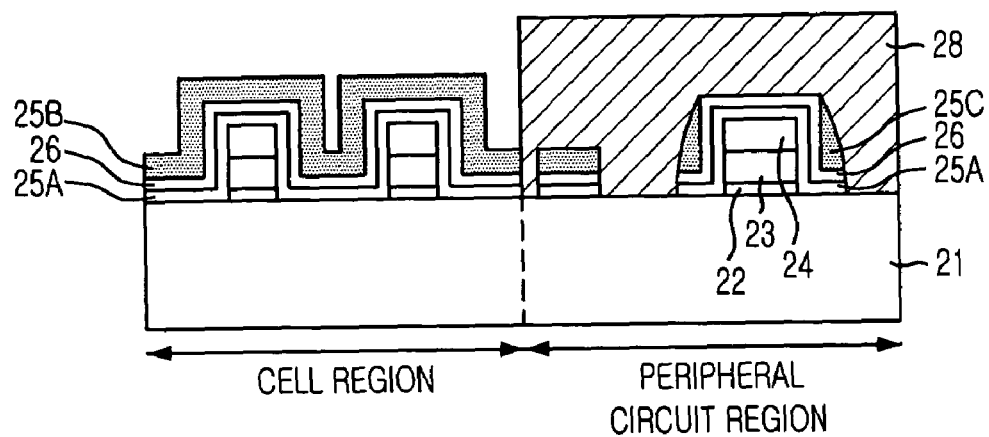

Referring to FIG. 2D, the peripheral circuit opening mask layer 27A and the wall mask layer 27B are removed, and a photosensitive layer is coated on an entire surface of the resulting structure. The photosensitive layer is patterned through a photo-exposure and developing process to form a cell region opening mask layer 28 opening the cell region. At this time, the cell region opening mask layer 28 is formed in such a manner that it covers the whole region of the peripheral circuit region including the separated space in the boundary region between the cell region and the peripheral circuit region.

Figure 2E:
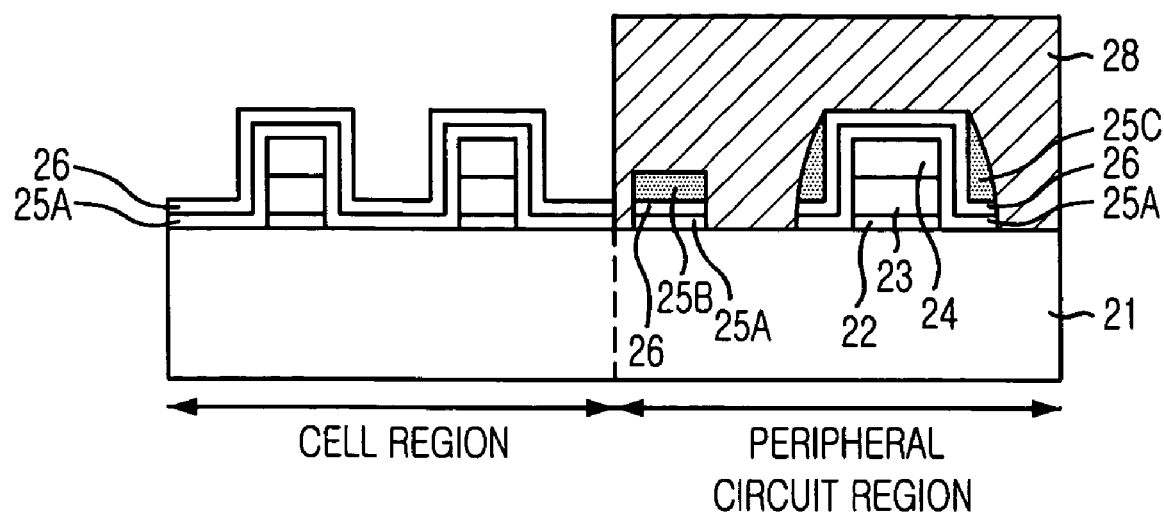

Referring to FIG. 2E, the second oxide layer 25B formed in the cell region is etched through a wet etching process employing hydrofluoric acid (HF). At this time, the cell region opening mask layer 28 is used as an etch mask. Also, since the cell region opening mask layer 28 covers the substrate 21 exposed in the boundary region between the cell region and the peripheral circuit region, the wet chemical, HF, is suppressed from diffusing into the peripheral circuit region. That is, sidewalls of the second oxide layer 25B are free from damage or loss due to the suppression of the HF diffusion into the peripheral circuit region during the wet etching of the second oxide layer 25B.

After the wet etching process, the line-type guard formed with the sequentially stacked first oxide layer 25A, nitride layer 26 and second oxide layer 25B remains on the substrate 31 in the peripheral circuit region. On the other hand, the nitride layer 26 functions as an etch barrier layer so that the second oxide layer 25B is selectively etched.

As described above, the guard is formed in the boundary region between the cell region and the peripheral circuit region by forming the wall mask layer 27B in the vicinity of the peripheral circuit region opening mask layer 27A for forming the spacer 25C in the peripheral circuit region. Then, the cell region opening mask layer 28 filling the separated region between the cell region and the peripheral circuit region is formed to prevent sidewalls of the second oxide layer 25B from being wet-etched during the wet etching process. Also, it is not necessary to remove the guard formed in the peripheral circuit region because it is formed in the region that is not related to the ion-implantation region. Furthermore, the separated space formed in the boundary region between the cell region and the peripheral circuit region is filled with a subsequent inter-layer insulation layer.

As a result of the formations of the guard and the cell region opening mask layer, there dose not exist the sidewall loss of the second oxide layer, and thus, it is further possible to easily establish the corresponding database. Concurrently, it is also possible to perform an excessive etching so as to prevent scummy remnants or the oxide layer from remaining in the cell region.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:

forming a plurality of gate line patterns on a substrate with a defined cell region and a peripheral circuit region;

forming sequentially a first insulation layer and a second insulation layer;

forming a first mask layer covering the cell region on the second insulation layer in the cell region and forming a second mask layer in the peripheral circuit region, wherein the second mask layer is separated from the first mask layer;

etching the second insulation layer with use of the first and the second mask layers as an etch mask to form a spacer at both sidewalls of each gate line pattern in the peripheral region and simultaneously form a guard beneath the second mask layer;

removing the first and the second mask layers;

forming a third mask layer covering the whole regions of the peripheral circuit region including a guard region, thereby opening the cell region; and performing a wet etching process to the second insulation layer remaining in the cell region by using the third mask layer as an etch mask.

2. The method as recited in claim 1, wherein the second mask layer is disposed with a separation distance from the first mask layer and opens a boundary region between the cell region and the peripheral circuit region.

3. The method as recited in claim 1, wherein the spacer and the guard beneath the second mask layer are formed through an etch-back process performed to the first and the second insulation layers until a surface of the substrate in the peripheral circuit region is exposed.

4. The method as recited in claim 1, wherein the first insulation layer is a stacked layer of an oxide layer and a nitride layer and the second insulation layer is an oxide layer.

5. The method as recited in claim 1, wherein the step of performing the wet etching process to the second insulation layer is carried out by using hydrofluoric acid (HF).

6. The method as recited in claim 1, wherein a boundary region is formed between the first mask layer and the second mask layer.

7. The method as recited in claim 6, wherein the boundary region is covered by the third mask layer.

* * * * *